(12) United States Patent
Wunderlich et al.

(10) Patent No.: US 6,698,648 B2
(45) Date of Patent: Mar. 2, 2004

(54) METHOD FOR PRODUCING SOLDERABLE AND FUNCTIONAL SURFACES ON CIRCUIT CARRIERS

(75) Inventors: Christian Wunderlich, Velten (DE); Petra Backus, Berlin (DE); Hartmut Mahlkow, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 53 days.

(21) Appl. No.: 09/937,363

(22) PCT Filed: Mar. 28, 2001

(86) PCT No.: PCT/DE01/01232
§ 371 (c)(1),
(2), (4) Date: Jan. 17, 2002

(87) PCT Pub. No.: WO01/76334
PCT Pub. Date: Oct. 11, 2001

(65) Prior Publication Data
US 2003/0052157 A1 Mar. 20, 2003

(30) Foreign Application Priority Data
Apr. 4, 2000 (DE) .......................... 100 18 025

(51) Int. Cl.[7] .................. B23K 31/02; B23K 35/24; H01B 13/00
(52) U.S. Cl. .................. 228/215; 228/225; 228/33; 228/39; 216/18; 29/840
(58) Field of Search .................. 228/215, 225, 228/33, 39, 41, 180, 22; 427/96–98; 29/840; 216/13, 17, 18, 19

(56) References Cited

U.S. PATENT DOCUMENTS

| | | | | |
|---|---|---|---|---|
| 4,104,111 A | * | 8/1978 | Mack | 216/18 |
| 4,424,241 A | | 1/1984 | Abys | |
| 4,487,654 A | * | 12/1984 | Coppin | 216/18 |
| 4,720,324 A | * | 1/1988 | Hayward | 216/18 |
| 4,816,070 A | | 3/1989 | Holtzman et al. | |
| 5,202,151 A | | 4/1993 | Ushio et al. | |
| 5,235,139 A | * | 8/1993 | Bengston et al. | 174/257 |
| 5,250,105 A | * | 10/1993 | Gomes et al. | 106/1.11 |
| 5,311,404 A | | 5/1994 | Trask | |
| 5,318,621 A | | 6/1994 | Krulik et al. | |
| 5,364,460 A | | 11/1994 | Morimoto et al. | |
| 5,470,381 A | | 11/1995 | Kato et al. | |
| 5,536,908 A | * | 7/1996 | Etchells et al. | 174/257 |
| 5,615,477 A | * | 4/1997 | Sweitzer | 29/840 |
| 5,869,126 A | * | 2/1999 | Kukanskis | 427/97 |
| 6,044,550 A | * | 4/2000 | Larson | 29/852 |
| 6,242,078 B1 | * | 6/2001 | Pommer et al. | 428/209 |
| 6,278,153 B1 | * | 8/2001 | Kikuchi et al. | 257/310 |
| 6,383,401 B1 | * | 5/2002 | Labzentis et al. | 430/314 |

FOREIGN PATENT DOCUMENTS

| | | |
|---|---|---|
| DE | 1690338 | 5/1971 |
| DE | 3011697 A1 | 10/1981 |
| DE | 3312725 A1 | 10/1984 |
| DE | 3704547 A1 * | 8/1988 |
| DE | 4201129 A1 | 7/1992 |
| DE | 4311266 A1 | 10/1993 |
| DE | 19745601 A1 | 4/1999 |
| DE | 19745602 C1 | 7/1999 |
| DE | WO 99/55935 | 11/1999 |
| EP | 0697805 A1 | 2/1996 |
| GB | 2273257 A | 6/1994 |

OTHER PUBLICATIONS

International Search Report (Aug. 21, 2001) in PCT/DE01/01232.

* cited by examiner

*Primary Examiner*—Lynne Edmondson
(74) *Attorney, Agent, or Firm*—Frank J. Bonini, Jr.; John F. A. Earley, III; Harding, Earley, Follmer & Frailey

(57) ABSTRACT

Process for the production of at least one solderable surface in selected solder regions and of at least one functional surface in function regions differing from the solder regions on circuit carriers provided as well as of corresponding circuit carriers.

18 Claims, 1 Drawing Sheet

METHOD FOR PRODUCING SOLDERABLE AND FUNCTIONAL SURFACES ON CIRCUIT CARRIERS

BACKGROUND OF THE INVENTION

1. Field of the Invention

Figure 1:
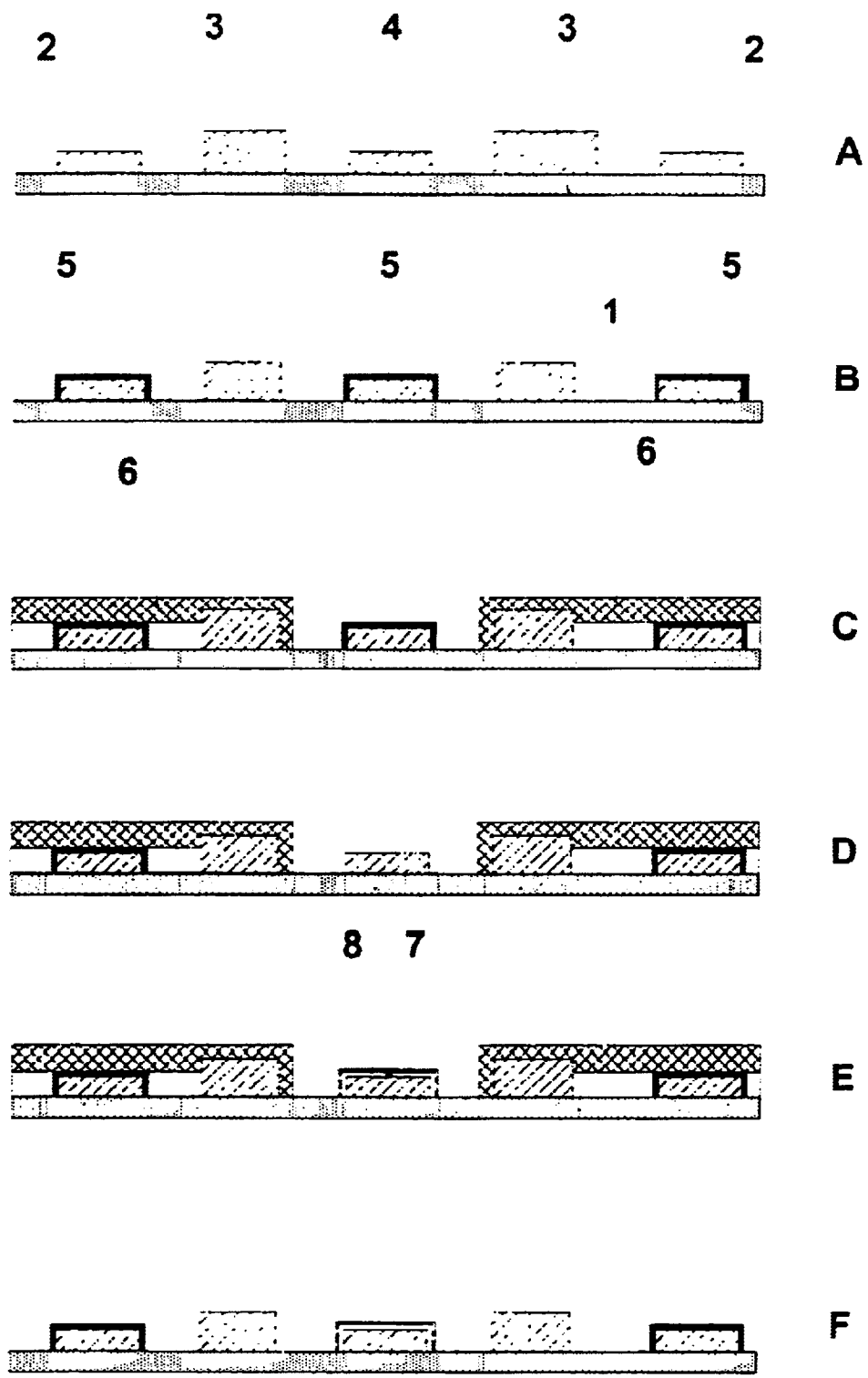

The invention relates to a process for the production of at least one solderable surface in selected solder regions and of at least one functional surface in function regions differing from the solder regions on circuit carriers provided with copper surfaces as well as of corresponding circuit carriers.

2. Brief Description of the Related Art

Circuit carriers serve to receive active and passive components. In principle, a distinction is made between conventional printed circuit boards and chip carriers. Whereas the first ones are packed with passive components such as capacitors and resistors for example and with cased semiconductor components, the chip carriers serve for the assembly of uncased semiconductor components. In parts, several uncased, and possibly cased semiconductor components too, are integrated into a single chip carrier. Such hybrid circuits are referred to as multichip modules. For some time, uncased semiconductor components have been directly integrated, without prior assembly, into a circuit carrier together with passive components. Such circuit carriers are so-called COB-(Chip-On-Board)-printed circuit boards.

Various processes for producing circuit carriers intended to be packed with passive components and uncased semiconductor components have been known. First, the circuit pattern that is needed for this purpose and that is made from copper is formed by means of well-known processes. Then, layers of gold for example are deposited to allow the circuit carriers to be packed. On one side, these layers serve to form solderable surfaces which are necessary for the insertion of passive components. On the other side, the gold surfaces are also suited for bonding cased and uncased semiconductor components.

U.S. Pat. No. 5,364,460 for example indicates that, among others, layers of gold are deposited by means of electroless plating onto printed circuit boards and cards for integrated circuits.

Coating copper structures on printed circuit board material is indicated in DE 43 11 266 A1. There, in one embodiment, parts of the printed circuit board's surface are first plated with gold, palladium, indium, rhodium, nickel, tin, lead or alloys of these elements, preferably with palladium, in those regions that are not to be provided with a solderable surface. Prior to this, the surface areas that are to be provided with the solderable surface are provided with a covering mask. Then, the mask is removed again. Thereupon, a solderable metal surface of a Tin/lead alloy is formed by means of electroless plating.

DE 33 12 725 A1 describes a method of producing thin film strip conductors with through hole connections that can be bonded and soldered on electrically non-conductive carriers in which the areas that can be bonded and soldered are formed by galvanic deposition of a layer of gold or of nickel/gold, respectively.

Gold layers are also formed to produce electrical contacts that may be opened, such as plug contacts for plugging the packed circuit carriers in contact plugs, and areas of contact for producing press buttons. DE-OS 1 690 338 mentions a method of producing multiple plug-type connections with gold surfaces in which, in the region of the plug-type connections and on the other circuit lines, a tin/lead alloy is first deposited by electroplating on a printed circuit board material that has been completely plated with a layer of copper whereupon nickel and gold are deposited in the region of the plugs onto the layer of terne metal, the bare layer of copper being etched upon removal of the electroplating lacquer. The reference indicates that the relatively soft layer located underneath the layer of nickel/gold is disturbing and that it has been observed that the circuit lines happen to be etched through at the transition zone between the gold contacts and the tin/lead alloy.

DE 197 45 602 C1 further indicates that layers of gold are utilized for producing surfaces that are capable of being soldered, glued or bonded. The methods described in this reference permit to produce circuit carriers of the finest structure with surface-mounted semiconductor circuits in which the circuits are connected to mating connecting pads on the circuit carrier by way of Ball-wedge-Bonds.

Layers of gold that have been produced by means of electroplating are not applied directly onto the copper surfaces. According to U.S. Pat. No. 5,364,460 for example, a layer containing nickel is deposited first and then the film of gold is deposited onto the layer containing nickel. The nickel containing layer is preferably formed by a layer of Ni/B or Ni/P which is deposited by means of electroless plating U.S. Pat. No. 5,470,381 also teaches to first deposit a layer containing nickel and then a layer of gold.

DE 197 45 602 C1, U.S. Pat. Nos. 5,202,151, 5,318,621, 5,364,460 and 5,470,381 describe methods of electroless gold plating.

Instead of the layer containing nickel, layers of another metal, of cobalt or palladium for example, can be deposited onto the copper surfaces prior to forming the layer of gold. In this respect, U.S. Pat. No. 5,202,151 proposes among other suggestions to apply a layer of cobalt to the copper surfaces and to deposit the layer of gold subsequently. Instead of electroplating a layer of nickel or cobalt, a layer of nickel or cobalt can also be applied by means of a vapor deposition process or by sputtering and then be electrolessly gold plated. DE 197 45 01 C1 moreover indicates a method of producing gold layers on a work piece that is provided with a palladium surface.

Instead of using a layer of gold, layers of palladium can also be utilized. DE 42 01 129 A1 describes a method of producing a wiring board in which a film of palladium is formed on the copper parts of the board by means of electroless plating, the palladium surfaces being produced on double-faced wiring boards in order to bond components of the surface-mounted technology-type by soldering them. Furthermore, U.S. Pat. No. 4,424,241 indicates a process of electrolessly plating palladium in which the layers of palladium formed serve for pattern delineation in electric circuits such as integrated circuits.

To produce layers of gold on the entire surface of the circuit carrier proved to be too expensive.

In most cases, smaller bondable areas only are needed on the surfaces of the circuit carriers while other surface areas only need to be suited for receiving components that are mounted by soldering. It has moreover been noticed that layers of gold with underlying layers of nickel for soldering so-called Ball-Grid-Arrays (BGA) lead to brittle fractures when the packed circuit carrier is subject to mechanical and/or thermal stress.

For this reason, a process has been developed in which those areas onto which components are intended to be soldered are first covered with an appropriate mask, e.g. a photoresist that can be structured, whereupon a layer combination of nickel and gold is deposited on the still bare areas. Then, the mask is cleared off the surface of the circuit carrier. Subsequently, an organic protective coating is formed by means of an aqueous acid solution of alkyl imidazole or of alkyl benzimidazole compounds. This protective coating prevents the copper surfaces from oxidizing and preserves solderability of the copper surfaces.

First, with this process, the combination layer of nickel and gold is only formed in those areas in which components are bonded or in which electric contact areas are needed. Second, this process eliminates the problem associated with soldering by means of the BGA technique.

It has been observed in carrying out this process though, that the appearance of the gold surfaces unfavorably changes in that the layers change to a reddish color. Additionally, the layer of nickel underneath the layer of gold is damaged by the processing chemicals. As a result, the electrical contact resistance is increased so that the possibility of using the combination layer of nickel and gold to form electrical contact areas is limited.

Soldering moreover proved to cause problems: it is virtually impossible to solder repeatedly at connection places for the components. Each soldering procedure performed after the first soldering increases the waste ratio. The only possibility of having soldering procedures performed repeatedly at connection places is to use a complicated remelting method employing inert gas (nitrogen for example) and expensive remelting devices. Sometimes wetting problems also occur on the copper surfaces provided with the organic protective coating.

SUMMARY OF THE INVENTION

The basic problem of the present invention therefore is avoiding the shortcomings of the known methods and more specifically finding a process by means of which components may be mounted on the surface of a circuit carrier both by bonding and by soldering as well. The invention moreover aims at producing soldered joints that are secure and do not cause any problem and at making it possible to repeat soldering procedures at individual connection places for components without any problem. The process furthermore is to be inexpensive and its realization simple. The process is to allow to form finest circuit structures, more specifically circuit lines and connection places for electronic components, wherein the structures with steep sides are to be reproducible.

The problem is solved by the process and circuit carrier of the present invention.

The process according to the invention serves to create at least one solderable surface in selected solder regions and at least one functional surface in function regions differing from the solder regions on surfaces of copper structures on circuit carriers. The preferably created functional surface is a bondable surface. In principle, the functional surfaces can also be suited for producing electrical contacts that can be opened.

The process involves the following steps:
to (a) first, a dielectric substrate provided with copper structures is provided;
(b) then, the solderable surfaces are created by depositing a solderable layer of metal;
(c) then, a covering mask is formed that covers the solder regions and leaves the function regions uncovered;
(d) subsequently, the functional surfaces are created in the function regions and (e) the covering mask is eventually cleared off.

The process according to the invention constitutes an inexpensive process since a functional surface is only formed in those regions on the surface of the circuit carriers in which bonded connections with the components are to be formed, whereas in the regions in which soldered connections are to be formed, an inexpensive solderable layer of metal is deposited. Furthermore, in using the BGA-technique, brittle fractures have not been observed.

A particular advantage thereof is the increased soldering safety as compared to the method using organic protective coatings for the copper surfaces. Most of all, the waste ratio with respect to solderability both in producing and in packing the circuit carriers as well is less than with the known methods. Repeated remelting or soldering of individual connection places for the components is possible without any problem. The wetting with the solder on the solderable surfaces formed according to the invention proved for example to still lie within the required tolerance even after remelting has taken place for the third time. Furthermore, the circuit carriers produced according to the invention proved to have very good storing properties, which are not detrimental to the solderability in the solder regions.

Additionally, the process according to the invention is not detrimental to the appearance of layers of gold serving as functional layers. The electric contact resistance of these layers is suited for forming electric contact areas that can be opened.

Another advantage over the method described in DE-OS 1 690 338 is that the circuit lines and connection places for electronic components that can be formed by means of the process according to the invention are very small, with a grid of 100 μm and less for example. The sides of the circuit lines and the connection places are very uniform i.e., they have very steep sides and a constant width. More specifically, no etching flaws such as undercuts, constrictions in the circuit lines or even disruption of the circuit lines, can be found.

To produce a solderable surface, preferably at least one metal, selected from the group comprising of tin, silver, bismuth, palladium and alloys thereof, is deposited. These metals can be deposited by means of electroless plating, i.e., in a chemically reductive or cementative manner so that even electrically isolated structures located on the surface of the circuit carriers can be plated with the solderable layer without any problem.

In the event the individual copper structures are still electrically connected in the manufacturing process, an electrolytic metal deposition method may also be employed. This is for example the case when the individual structures are first still connected to the so-called galvanic border, which is a greater copper conducting layer on the border of the circuit carrier material. In the process of producing the circuit carrier, this border is removed so that the circuit structures are electrically isolated from each other.

In that the circuit structures are already formed when the solderable layer and the functional layer are being produced, the sides of the structures, more specifically connection places for electronic components, may be plated with the solder layer and with the function layer. This results in an additional protection from corrosion and other detrimental influences. If the circuit structures were, e.g. formed by etching only after the solderable and functional layers have been applied, which is for example the case according to DE-OS 1 690 338, the unprotected sides of the circuit structures would possibly be attacked in the etching procedure so that the circuit structures created would not have uniform sides.

This problem does not exist with the process according to the invention. Therefore, very uniform circuit structures with even the smallest dimensions can be formed.

For tin deposition, the copper surfaces on the circuit carrier are first preferably cleaned, in particular with a cleaning solution (which is acid and contains surface-active agents). Then, the remainders of the cleaning solution are rinsed off the surfaces. Then, the copper surfaces are preferably etched slightly in order to make certain of sufficient adhesion of the metal layers applied subsequently. For this purpose, a commercial cleaning etch may be used, like for example an aqueous, sulfuric acid solution of hydrogen peroxide or of a caroate salt or an aqueous solution of sodium peroxodisulfate. After cleaning has been carried out by means of etching, the copper surfaces are rinsed again and then preferably treated by preliminary immersion into a solution of an acid, more specifically of sulfuric acid. Moreover, the copper surfaces can be catalysed with a solution that contains noble metal ions prior to treating them by preliminary immersion into the acid solution, which results in greater ease of tin deposition.

A conventional treating solution can be utilized for tin deposition. A cementative tin deposition bath is preferably used. In addition to at least one tin(II) compound, such baths contain acid and usually thiourea or a derivative of thiourea. These baths contain for example 15 g tin(II) fluoroborate, 100 ml fluoroboric acid. 100 g thiourea and 2 mg sodium lauryl sulfate in 1 l of an aqueous solution or 5 g tin(II) chloride, 55 g N-methyl thiourea, 20 g sulfuric acid, concentrated, 500 ml isopropanol and 500 ml water or 20 g tin(II) chloride, 25 ml hydrochloric acid (37% by weight), 50 ml sulfuric acid (50% by weight). 16 g sodium hypophosphite, 200 g thiourea and 0.5 g phenolsulphonic acid in 1 l of an aqueous solution. The treatment temperature amounts to 40–90° C. Treatment time ranges from 30 sec to 60 min. Further examples of such tinning baths are indicated in DE 30 11 697 A1, WO 99/55935 A1 and U.S. Pat. No. 4,816,070 for example. The formulations indicated in these documents are included in the process according to the invention as formulations that may be utilized.

Stated in general terms, to electrolessly deposit silver, the surfaces of the circuit carriers are first cleaned, then rinsed, subsequently treated with a bright etching solution (for example a $H_2SO_4/H_2O_2$ solution) and then rinsed again. Thereupon, the surfaces are preferably pretreated by preliminary immersion thereof in a solution containing sulfuric acid.

Then, the layer of silver is applied. For silver deposition a solution may be used that for example consists of a bath which has the following composition: 200 g sodium thiosulfate, 20 g sodium sulfite, 0.1 g disodium EDTA, 3 g silver as a silver-thiosulfate/sulfite complex, 5 g glycine in 1 l of an aqueous solution. The pH can be adjusted to approximately 7.5 for example and the treatment temperature to preferably 50–95° C. Treatment time amounts to 15 min. for example. Further examples are indicated in U.S. Pat. No. 5,318,621 among others. The formulations indicated in these documents are also included in the process according to the invention as formulations that may be utilized.

After the silver layer has been formed, the surfaces are preferably treated with an inorganic saline solution and then rinsed.

For the electroless deposition of palladium, a solution may for example be used that comprises 0.05 mol palladium acetate, 0.1 mol ethylene diamine, 0.2 mol sodium formate and 0.15 mol succinic acid in 1 l of an aqueous solution. The pH of this bath is preferably adjusted to 5.5 and the temperature to about 70° C. Further possible formulations comprise for example: 0.01 mol palladium chloride, 0.08 mol ethylene diamine, 20 mg thiodiglycolic acid and 0.06 mol sodium hypophosphite in 1 l of an aqueous solution (pH 8, 60° C.). Further indications and examples as well as appropriate conditions for pretreating the surfaces to be coated are to be found for example in DE 197 45 602 C1, DE 42 01 129 A1 and U.S. Pat. No. 4,424,241. The formulations indicated in these documents are included in the process according to the invention as formulations that may be utilized.

Once the solderable surfaces have been produced by depositing the solderable layer of metal, a covering mask is formed according to step (c) of the process, the solderable regions being covered by the mask. The function regions hereby remain free so that the functional surfaces may be produced in the function regions at a later stage (step (d) of the process).

To produce the covering mask, a structured photomask is preferably formed on the surface of the circuit carrier. The mask is created by using a photoresist and by carrying out the following sequential steps:

(c1) application of a layer of photoresist,
(c2) exposure of the layer of photoresist with a model of the mask in such a manner that the function regions can be led bare in a subsequent development stage and
(c3) development of the exposed layer of photoresist.

In an alternative variant of the embodiment, the mask which covers the solder regions and does not cover the function regions can also be formed by means of a screen printing process.

If tin, bismuth or an alloy of these metals are used to produce the solderable surface, the solderable layer of metal in the function regions is removed again, preferably by means of an acid etch solution prior to carrying out step (d) of the process. To remove these metals, an etch solution containing nitric acid and inhibitors (preferably imidazole derivatives) may be utilized. Palladium and silver as well as their alloys, when they form a solderable layer of metal, do not have to be removed. In this event, the function layer can be deposited on the layer of palladium, silver or of an alloy of these metals.

The functional surfaces are preferably formed by at least one metal selected from the group comprising of gold, palladium, silver and their alloys. The surfaces are more specifically formed by chemically reductive or cementative deposition. The deposition of particular preference is the deposition of a combined layer consisting of a layer of nickel and of a layer of gold applied on said layer of nickel. The circuit carrier according to the invention is preferably provided with at least one solderable surface of at least one metal selected from the group comprising tin, silver, palladium and their alloys and with at least one functional surface of gold, the surface of gold being formed by a combination layer consisting in a layer of nickel onto which gold is plated.

Prior to forming a layer of gold, a layer of nickel/phosphorus is preferably deposited by chemical reduction. As an alternative, a layer of nickel/bor or a layer of pure nickel can also be deposited. To form these layers, the circuit carriers may first be contacted with a solution containing a surface-active agent in order to completely wet the surfaces with the fluid. Thereupon, rinsing is performed. Then, the bare copper surfaces are etched by means of a commercial cleaning etch. Excess etch is then removed in another rinsing step. Then, the surfaces can be treated with a solution for preliminary immersion that contains sulfuric acid and then treated in an activating solution comprising palladium sulfate with a content of 80–120 mg/l of palladium and sulfuric acid with a content of approximately 50 ml/l. After the surfaces have been rinsed anew, a layer of nickel, nickel phosphorus or nickel bor is deposited.

Chemical nickel baths are actually known. Customarily, these baths are operated at a temperature ranging from 85 to 90° C. Solderability of tin layers proved to have a particularly advantageous behavior when temperature stress in depositing nickel is low. For this reason, the preferably used nickel baths are operated at a temperature below 85° C. more specifically below 80° C. the nickel bath of particular preference being operated at a temperature below 75° C. It has been found that particularly favorable conditions are reached when a temperature of from 70 to 75° C. is adjusted for the electroless deposition of nickel.

For the electroless deposition of gold, baths having the following formulation can be used: 0.015 mol sodium tetrachloroaurate-(III), 0.1 mol sodium thiosulfate, 0.04 mol thiourea, 0.3 mol sodium sulfite and 0.1 mol sodium tetraborate in 1 l of an aqueous solution (pH 8.0, 90° C.) or 3 g sodium gold(l) sulfite, 70 g sodium sulfite, 110 g sodium ethylene diamine tetra(methylene phosphonate) and 10 g hydrazine hydrate in 1 l of an aqueous solution (pH 7, 60° C.). Further examples are indicated in U.S. Pat. Nos. 5,202,151, 5,364,460, 5,318,621 and 5,470,381 for example. The formulations indicated in these documents are included in the process according to the invention as formulations that may be utilized.

If the layer of gold is directly deposited on a layer of palladium that may be used as a solderable layer of metal with no additional layer of nickel, the following formulation may be used for example: 3 g sodium gold(I) cyanide, 20 g sodium formate, 20 g β-alanine diacetic acid in 1 l of an aqueous solution (pH 3.5, 89° C.). Further examples of this application are indicated among others in DE 197 45 602 C1. The formulations indicated in these documents are included in the process according to the invention as formulations that may be utilized.

If the layer of gold is deposited on a layer of palladium that is utilized as a solderable layer of metal with an additional layer of nickel, the sequence observed for the process is as follows:

First, the circuit carriers that are provided with the surfaces of palladium are contacted with a solution containing surface-active agents in order to make sure that the entire surface be wetted with fluid. Then, excess surface-active solution is rinsed off again and a layer of nickel is thereupon deposited in a well-known manner. The layer of gold is formed upon rinsing.

To deposit a combination layer of nickel,gold on a layer of silver, the circuit carriers provided with the layer of silver are preferably first treated with a wetting solution. whereupon they are rinsed, subsequently treated in a solution for preliminary immersion containing inorganic salts and finally treated with a silver activation solution. After renewed rinsing, the layer of nickel can be applied and upon another rinsing step, the layer of gold.

To deposit layers of palladium and silver, reference is made to the above mentioned examples for producing solderable surfaces.

Prior to performing step (b) of the process, the circuit carriers provided with the copper surfaces are preferably provided with a solder resist mask.

The process as it has been presented can be carried out in a conventional way in plating tanks, the circuit carriers being fastened onto racks and being dipped one after the other together with the racks from which they are vertically hanging into the discrete treating baths. An advantageous treatment consists in conveying the circuit carriers through a conventional continuous plant in which the circuit carriers are conveyed through the plant in horizontal direction of transportation and horizontal or vertical operational position, thereby being successively brought into contact with the discrete treating solutions. For this purpose, these solutions are delivered to the surfaces of the circuit carriers by way of nozzles. In these plants the circuit carriers may also be conveyed through a banked-up bed of fluid though, with no nozzles provided for delivering the treating solution.

BRIEF DESCRIPTION OF THE DRAWING FIG.

FIG. 1 is a schematic illustrating the steps of the process according to the present invention.

DETAILED DESCRIPTION OF THE PREFERRED EMBODIMENTS

The following examples as well as FIG. 1 that shows an exemplary embodiment of the invention serve to explain more fully the present invention. FIG. 1 shows the steps of the process according to the invention in schematic form:

According to step A of the process, the initial condition is shown, copper structures 2 and 4 being represented on a substrate 1 of the circuit carrier. The connection places formed from the copper structures 2 serve to mount components which are attached by soldering. The connection places formed from the copper structures 4 serve to mount components with are attached by bonding. In principle, the copper structures 4 can also serve to produce contact areas. Regions provided with a solder resist mask 3 can be seen between the copper structures 2 and 4.

In the present example, a layer of tin 5 is first deposited onto all the copper surfaces of the structures 2 and 4 (step B of the procedure).

Then, a covering mask 6 is applied over those regions on the circuit carrier that are to be provided with a solderable surface (step C of the procedure). The covering mask 6 applied is a layer of photoresist that can be structured, said layer being accomplished by lamination of a commercial dry film resist, subsequent exposure of the layer of resist with the desired pattern for the bonding places and development of the exposed layer of resist.

In accordance with step D of the process, the layer of tin 5 is subsequently completely removed from the copper structures 4 by means of a tin stripper.

Then, a nickel/phosphorus layer 7 is deposited onto the surfaces of the copper structures 4 that have been laid bare and a layer of gold 8 is deposited onto the layer of nickel/phosphorus 7 (step E of the process).

To conclude, the covering mask 6 is cleared off again (step F of the process).

EXAMPLE 1

A completely structured printed circuit board that has been provided with strip conductors, solder pads, bond pads, circuit structures and metallized bores is coated with a solderable layer of tin according to the following Process Sequence I:

Process Sequence I:

| Process stage | Treatment time [min] | Temperature (° C.) |
|---|---|---|
| cleaning | 3–6 | 30–40 |
| rinsing | 2–3 | ambient temperature |
| etching | 2–3 | 20–30 |
| rinsing | 2–3 | ambient temperature |
| preliminary immersion | 1–3 | 25–35 |
| tin deposition | 8–15 | 58–68 |

The cleaning solution used was an acid solution comprising surface-active agents, the etching solution was a sulfuric acid solution comprising sodium peroxodisulfate and the solution for preliminary immersion was a solution comprising sulfuric acid. The solution for tin deposition had the following formulation:

10 g/l tin" as tin salt 80 g/l thiourea 80 ml/l methane sulfonic acid

A film of tin, of from 0.6 to 1.0 μm thick, was deposited under the conditions applied.

Then, the board was provided with a covering mask by laminating a dry film resist (W140 from DuPont de Nemours, Germany) on the surfaces of the printed circuit boards in accordance with the directions for use, exposing the layer of resist with the desired pattern and subsequently developing the exposed layer of resist. After the structuring process had been carried out, some of the regions were covered by the resist (solder regions), others were lying are (function regions).

The layers of tin lying bare in the function regions and the intermetallic tin copper phases on the copper structures were then removed by means of a tin stripper containing nitric acid.

After the circuit board had been rinsed in a subsequent step, a layer of nickel/phosphorus was first electrolessly deposited onto the bare copper surfaces and then a layer of gold. For this purpose, the following Process Sequence II was employed:

Process Sequence II:

| Process stage | Treatment time [min] | Temperature [° C.] |
|---|---|---|
| wetting | 2–3 | 30–40 |
| rinsing | 2–3 | room temperature |
| etching | 2–3 | 20–30 |
| rinsing | 2–3 | room temperature |
| preliminary immersion | 3–5 | room temperature |
| activation | 1–3 | room temperature |
| rinsing | 2–3 | room temperature |
| nickel deposition | 20–30 | 70–80 |
| rinsing | 2–3 | room temperature |
| gold deposition | 8–12 | 70–80 |

Again, the cleaning solution used was an acid solution comprising surface-active agents, the etching solution was a sulfuric acid solution comprising sodium peroxodisulfate and the solution for preliminary immersion was a solution comprising sulfuric acid. The solution for the electroless deposition of nickel had the following formulation:

24–34 g/l $NiSO_4 \cdot 7H_2O$

30–40 g/l $NaH_2PO_2 \cdot H_2O$

15–25 g/l lactic acid stabilizers.

A layer of nickel phosphorus, of from 3 to 6 μm thick, as deposited.

The solution for electrolessly depositing gold had the following formulation:

2 g/l Au of a complex gold salt 40 g/l ethylene diamine tetraacetic acid

A layer of gold, of from 0.05 to 0.10 μm, was deposited.

Upon deposition of gold, the structured layer of photoresist was cleared off the surface of the printed circuit board by means of a conventional method, the board was rinsed and dried intensively. Accordingly, the finished printed circuit board showed regions that were coated with tin for soldering and with a combination layer of nickel and gold for carrying out bonding processes as well as for function layer serving other purposes, such as electric contact areas for example.

To determine solderability of the copper structures coated with the chemical layer of tin, tests were performed for wetting the surfaces with liquid solder by means of the so-called Solder-Spread-Test. For this purpose, the wetting angle was indirectly determined upon wetting by measuring the size of a melted solder globule which permitted to calculate the wetting angle. Particularly good wetting was ascertained when the determined wetting angle was small. The average wetting angle should lie below 10°, standard deviation should not be in excess of 1°.

The following conditions were compared:
1) A chemical layer of tin was applied onto a copper surface and the wetting test was performed on the layer of tin.
2) The wetting test was performed on the chemically formed layer of tin upon removal of the dry resist (in accordance with step C of the process according to FIG. 1).
3) The wetting test as performed upon application of the combination layer of nickel and gold and upon removal of the dry resist by means of a solution comprising methanol amine at 50° C. and subsequent first rinsing in a solution that also contained methanol amine and subsequent second rinsing in de-ionized water (in accordance with step F of the process according to FIG. 1).

Two different dry film resists were used as covering masks (resist 1: W140 from DuPont de Nemours, resist 2: HW440 from Hitachi).

Table A below indicates the determined wetting angles yielded by the wetting test:

TABLE A

| | Test Condition 1 (chem. Sn) | Test Condition 2 (after step C) | Test Condition 3 (after step F) |
|---|---|---|---|
| Resist 1 | 4.9° ± 0.6° | 5.9° ± 0.8 | 5.7° ± 0.7° |
| Resist 2 | 6.0° ± 0.7° | 4.7° ± 0.9 | 6.2° ± 0.8° |

Then, the tests were repeated, this time however, a bath of nickel was used in which the coating temperature was adjusted to range from 85 to 90° C. The determined wetting angles are indicated in Table B:

TABLE B

| | Test Condition 1 (chem. Sn) | Test Condition 2 (after step C) | Test Condition 3 (after step F) |
|---|---|---|---|
| Resist 1 | 3.9° ± 1.0° | 9.9° ± 0.9 | 14.5° ± 1.7° |
| Resist 2 | 4.8° ± 0.5° | 11.3° ± 0.9 | 12.2° ± 1.1° |

The results yielded by the wetting tests clearly show that very good soldering results are obtained when the temperature of the nickel bath is low.

EXAMPLE 2

A printed circuit board structured according to the process described in Example 1, but additionally provided with a solder resist mask that partially covered the copper structures, was plated with a thin layer of palladium according to Process Sequence III:

Process Sequence III:

| Process stage | Treatment time [min] | Temperature [° C.] |
|---|---|---|
| cleaning | 2–6 | 30–40 |
| rinsing | 2–3 | room temperature |
| etching | 2–3 | 20–30 |
| rinsing | 2–3 | room temperature |
| preliminary immersion | 3–5 | room temperature |
| activation | 3–5 | 30 |
| rinsing | 1–2 | room temperature |
| deposition of Pd | 4–8 | 55–65 |

Again, the cleaning solution used was an acid solution comprising surface-active agents, the etching solution was a sulfuric acid solution comprising sodium peroxodisulfate and the solution for preliminary immersion was a solution comprising sulfuric acid. The solution for the electroless deposition of palladium had the following formulation:

0.7–1.2 g/l $Pd^{2+}$ as palladium sulfate 10 g/l ethylene diamine 0.2 mol/l sodium formiate.

A film of palladium, of from 0.1 to 0.25 $\mu$m, was deposited.

Then, a covering mask was applied onto the surface of the printed circuit board and structured, the conditions and materials used being identical with those used in Example 1.

Then, a combination layer of nickel and gold was directly applied onto the layer of palladium according to Process Sequence IV.

Process Sequence IV:

| Process stage | Treatment time [min] | Temperature [° C.] |
|---|---|---|
| wetting | 2–3 | 30–40 |
| rinsing | 2–3 | room temperature |
| deposition of nickel | 20–30 | 70–80 |
| rinsing | 2–3 | room temperature |
| deposition of gold | 8–12 | 70–80 |

A solution containing surface-active agents was used to wet the surfaces of the circuit carriers. The formulation for the solutions for the electroless deposition of nickel or gold respectively was the same than for the solutions for depositing nickel and gold respectively that were indicated in Example 1. A layer of nickel, of from 3 to 6 $\mu$m thick, and a layer of gold, of from 0.05 to 0.10 $\mu$m thick, were deposited.

The subsequent treatment of the printed circuit board aiming at removing the covering mask was identical to that according to Example 1.

Besides solder regions with palladium surfaces, the board had regions with gold surfaces for high-grade functions.

EXAMPLE 3

A printed circuit board structured and coated with a solder resist mask according to Example 2 was electrolessly silver plated in accordance with Process Sequence V:

Process Sequence V:

| Process stage | Treatment time [min] | Temperature [° C.] |
|---|---|---|
| cleaning | 3–6 | 30–40 |
| rinsing | 2-3 | room temperature |
| bright etching | 2-3 | 20–30 |
| rinsing | 2-3 | room temperature |
| preliminary immersion | 1 | room temperature |
| deposition of silver | 1–2 | 35–45 |
| subsequent immersion | 1 | room temperature |
| rinsing | 1–2 | room temperature |

To clean the surfaces of the circuit carriers, an acidic solution comprising surface-active agents was again used, the bright etch solution used comprised $H_2O_2/H_2SO_4$, the solution for preliminary immersion utilized was a solution comprising inorganic salts and the solution for subsequent immersion was a solution containing inorganic salts as well.

A layer of silver, of from 0.10 to 0.20 $\mu$m thick, was deposited.

Then, a covering mask was applied onto the surface of the printed circuit board and was structured, the conditions and the materials used being identical to those used in Example 1. As a result, the silver surfaces were partially left open. These surfaces were subsequently prepared for nickel/gold deposition by means of an activation process and then plated with a combination layer of nickel and gold. The silver layer was not removed. The Process Sequence VI used therefore is indicated below:

Process Sequence VI:

| Process stage | Treatment time [min] | Temperature [° C.] |
|---|---|---|
| wetting | 2–3 | 30–40 |
| rinsing | 2–3 | room temperature |
| preliminary immersion | 3–5 | room temperature |
| activation of silver | 1–3 | room temperature |
| rinsing | 2–3 | room temperature |
| deposition of nickel | 20–30 | 70–80 |
| rinsing | 2–3 | room temperature |
| deposition of gold | 8–12 | 70–80 |

The wetting solution and the solution for preliminary immersion used had the same composition as those used in the Examples 1 and 2. The solution used to activate with silver contained $Pd(NO_3)_2$. The solutions for the electroless deposition of nickel and gold respectively had the same compositions as the solutions for depositing nickel and gold respectively used in Example 1. A layer of nickel, of from 3 to 6 $\mu$m thick, and a layer of gold, of from 0.05 to 0.10 $\mu$m thick, were deposited.

The subsequent treatment of the printed circuit board aiming at removing the covering mask was identical to the treatment in Example 1.

Besides pads and bores clad with silver destined to soldering, regions serving for high-grade functions were plated with the combination layer of nickel and gold.

Comparative test VI:

A printed circuit board with strip conductors, solder pads, bond pads, circuit structures and metallized bores was provided with a solder resist mask and treated according to the following Process Sequence VII:

Process Sequence VII:

Application of a layer of dry film resist
Exposure with the desired pattern
Development of the exposed resist
Deposition of nickel
Deposition of gold
Removal of the resist
Application of an organic protective coating The conditions and materials used for application, exposure, development and removal of the dry film resist upon deposition of the combination layer of nickel and gold were identical to the conditions prevailing and the materials used in Example 1. The processing conditions and the compositions of the baths for depositing the layer of nickel and the gold layer were also identical to the conditions prevailing and the compositions of the baths used in Example 1.

To apply the organic protective coating, a solution comprising 10 g/l 2-n-heptyl benzimidazole
32 g/l formic acid
in water was applied at 40° C. for 2 min. For this purpose, the bare copper surfaces were first pretreated with an etch solution containing $KHSO_5$ and $H_2SO_4$.

The aging stability of the solderable surfaces was determined on the thus produced printed circuit boards (test articles labelled with "OSP"). The results obtained were compared with the results that had been obtained on tin surfaces produced according to the process used in Example 1 (test articles labelled with "chem. Sn").

To evaluate the aging stability the test articles were each subjected to different conditions of temperature:
1) Tests with articles without temperature treatment;
2) Tests with articles that were submitted to a reflow procedure once;
3) Tests with articles that were submitted to a reflow procedure three times;
4) Tests with articles that were tempered in air at 155° C. for 4 hours.

Reflow was carried out under the following conditions: a certain quantity of the soldering paste RP 10 of Multicore was pressed upon the surfaces to be tested at a thickness of 120 μm and then heated in a reflow oven to a temperature exceeding the melting point. The solder of the paste liquefied in the process and spread over the wettable surfaces.

The wetting time $t_B$ [sec], the wetting force $F_2$ [mN/mm] after 2 sec and the wetting force $F_6$ [mN/mm] after 6 sec were measured for each test article by means of a soldering scales (Menisto ST-50 by Metronelec, FR). Solderability of the surfaces tested was the higher, the lower the wetting time and the higher the wetting force.

The results are summarized in Table C:

TABLE C

| Test Article | Aging Test | $t_B$ [sec] | $F_2$ [mN/mm] | $F_6$ [mN/mm] |
|---|---|---|---|---|
| chem. Sn | Test condition 1 | 0.35 | 0.181 | 0.179 |
| OSP | Test condition 1 | 0.53 | 0.164 | 0.170 |
| chem. Sn | Test condition 2 | 0.54 | 0.185 | 0.184 |
| OSP | Test condition 2 | 0.78 | 0.089 | 0.086 |
| chem. Sn | Test condition 3 | 0.7 | 0.158 | 0.186 |
| OSP | Test condition 3 | 0.96 | 0.085 | 0.088 |

TABLE C-continued

| Test Article | Aging Test | $t_B$ [sec] | $F_2$ [mN/mm] | $F_6$ [mN/mm] |
|---|---|---|---|---|
| chem. Sn | Test condition 4 | 1.13 | 0.094 | 0.139 |
| OSP | Test condition 4 | no wetting | −0.184 | −0.186 |

The results indicated above clearly show that temperature treatment is not prejudicial to the solderability of the surfaces produced by means of the process according to the invention. The values obtained further reveal that the wetting time is the longer the more temperature treatment is important. The wetting force is substantially independent of the temperature stress. Therefrom it may be inferred that no adverse consequences due to aging of the solderable surfaces produced according to the process of the invention ensue.

By contrast, the solderability of the copper surfaces plated with the organic protective coating suffers considerably from the temperature treatment. Test articles aged under test condition 4 cannot be soldered any more at all.

What is claimed is:

1. Process for the production of at least one solderable surface in selected solder regions and of at least one functional surface in function regions differing from the soldering regions on surfaces of copper structures on circuit carriers with the following sequential process stages:
   (a) a dielectric substrate provided with copper structures is prepared;
   (b) the solderable surfaces are created by depositing a solderable layer of metal;
   (c) a covering mask is formed that covers the solder regions and leaves the function regions uncovered;
   (d) the functional surfaces are created in the function regions; and
   (e) the covering mask is cleared off.

2. Process according to claim 1, wherein the at least one solderable surface is made from at least one metal selected from the group comprising tin, silver, bismuth, palladium and their alloys.

3. Process according to claim 1, wherein the at least one solderable surface is formed by depositing at least one solderable layer of metal by means of chemical reduction or cementation.

4. Process according to claim 3, wherein the at least one solderable layer of metal is removed again prior to carrying out stage (d) of the process in the function regions.

5. Process according to claim 4, wherein the at least one solderable layer of metal is removed by means of an acid etch solution.

6. Process according to claim 1, wherein the at least one bondable surface is produced to serve as a functional surface.

7. Process according to claim 1, wherein at least one functional surface is made of at least one metal, selected from the group comprising gold, palladium, silver and their alloys.

8. Process according to claim 7, wherein for the purpose of producing the at least one functional surface, a basic layer is first applied, said being made from a metal selected from the group comprising nickel, cobalt and their alloys.

9. Process according to claim 1, wherein for the purpose of producing the at least one functional surface, a layer comprising nickel is deposited first and a layer of gold is applied there onto.

10. Process according to claim 1, wherein the at least one functional surface is formed by the deposition of at least one functional layer by means of chemical reduction or cementation.

11. Process according to claim 1, wherein the covering mask is formed by performing the following steps:
   (c1) application of a layer of photoresist
   (c2) exposure of the layer of photoresist with a model of the mask in such a manner that the function regions can be led bare in a subsequent development stage and
   (c3) development of the exposed layer of photoresist.

12. Process according to claim 1, wherein the covering mask is formed by means of a screen printing process.

13. Process according to claim 1, wherein the circuit carriers provided with the copper surfaces are provided with a solder resist mask prior to carrying out step (b) of the procedure, the solder regions and the function regions remaining bare.

14. Process according to claim 2, wherein the at least one solderable surface is formed by depositing at least one solderable layer of metal by means of chemical reduction for cementation.

15. Process of claim 2, wherein the at least one bondable surface is produced to serve as a functional surface.

16. Process according to claim 2, wherein the at least one functional surface is made of at least one metal, selected from the group comprising gold, palladium, silver and their alloys.

17. Process according to claim 3, wherein, for the purpose of producing the at least one functional surface, a layer comprising nickel is deposited first and a layer of gold is applied there onto.

18. Process according to claim 1, wherein the at least one solderable surface is made from at least one metal selected from the group comprising tin, silver, bismuth, palladium and their alloys; wherein the at least one solderable surface is formed by depositing at least one solderable layer of metal by means of chemical reduction or cementation; wherein the at least one solderable layer of metal is removed again prior to carrying out stage (d) of the process in the function regions; wherein the at least one solderable layer of metal is removed by means of an acid etch solution; wherein the at least one bondable surface is produced to serve as a functional surface; wherein the at least one functional surface is made of at least one metal, selected from the group comprising gold, palladium, silver and their alloys; wherein, for the purpose of producing the at least one functional surface, a layer comprising nickel is deposited first and a layer of gold is applied there onto; wherein the at least one functional surface is formed by the deposition of at least one functional layer by means of chemical reduction or cementation; wherein the covering mask is formed by performing the following steps:
   (c1) application of a layer of photoresist
   (c2) exposure of the layer of photoresist with a model of the mask in such a manner that the function regions can be led bare in a subsequent development stage and
   (c3) development of the exposed layer of photoresist.

* * * * *